(12) United States Patent
Daniel et al.

(10) Patent No.: US 8,389,346 B2
(45) Date of Patent: Mar. 5, 2013

(54) METHOD AND STRUCTURE FOR ESTABLISHING CONTACTS IN THIN FILM TRANSISTOR DEVICES

(75) Inventors: Jurgen H. Daniel, San Francisco, CA (US); Ana Claudia Arias, Los Gatos, CA (US); Michael Chabinyc, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/594,507

(22) Filed: Aug. 24, 2012

(65) Prior Publication Data
US 2012/0322214 A1    Dec. 20, 2012

Related U.S. Application Data

(62) Division of application No. 12/324,250, filed on Nov. 26, 2008, now Pat. No. 8,274,084.

(51) Int. Cl.
*H01L 29/10* (2006.01)

(52) U.S. Cl. .................. 438/151; 257/66; 257/E29.288; 257/E21.411

(58) Field of Classification Search .................... 257/66, 257/E29.288, E21.411; 438/151
See application file for complete search history.

(56) References Cited

U.S. PATENT DOCUMENTS

| | | | |
|---|---|---|---|
| 5,574,294 A | * | 11/1996 | Shepard .......................... 257/66 |
| 2006/0148167 A1 | * | 7/2006 | Brown et al. .................. 438/232 |

* cited by examiner

*Primary Examiner* — Jami M Valentine
(74) *Attorney, Agent, or Firm* — Fay Sharpe LLP (57) ABSTRACT

The roughness and structural height of printed metal lines is used to pin a fluid. This fluid deposits a top contact material which is connected to the bottom printed contacts through pinholes in the hydrophobic polymer layer. This results in a sandwich-like contact structure achieved in a self-aligned deposition process and having improved source-drain contact for all-additive printed circuits. In one form, the present technique is used for thin film transistor applications, but it may be applied to electrodes in general.

7 Claims, 6 Drawing Sheets

METHOD AND STRUCTURE FOR ESTABLISHING CONTACTS IN THIN FILM TRANSISTOR DEVICES

This application is a divisional of and claims priority to co-pending U.S. application Ser. No. 12/324,250, filed Nov. 26, 2008, which is hereby incorporated herein by reference.

CROSS REFERENCE TO RELATED PATENTS AND APPLICATIONS

This application is related to U.S. application Ser. No. 12/324,207, filed on Nov. 28, 2008, entitled, "Thin Film Transistors and High Fill Factor Pixel Circuits and Methods for Forming Same," and naming Daniel et al. as inventors and U.S. application Ser. No. 12/324,304, filed on Nov. 26, 2008, entitled, "An Electronic Circuit Structure and Method for Forming Same," and naming Daniel et al. as inventors.

BACKGROUND

The development of thin film transistors (TFTs) using printing techniques has uncovered a number of issues that should be addressed before large scale production of such devices becomes more prevalent. Typically, such devices have as one of its components a gate dielectric. So, for example, it has been found that a hydrophobic gate dielectric results in improved molecular ordering of the organic semiconductor and, therefore, improved performance in organic TFTs. To achieve such hydrophobicity (or low-surface energy), often a silane surface modification is implemented.

In this regard, Salleo et al. observed a significantly increased TFT mobility with a solution processed polyfluorene (F8T2) semiconductor on octadecyltrichlorosilane (OTS) treated silicon dioxide (Salleo, et al. App. Phys. Lett, 81, 2002, 4383). The same low-surface energy silane treatment was also effective with other organic semiconductors such as the polythiophene PQT-12. When treating a silicon dioxide surface with a silane, the silane reacts with hydroxyl groups on the silicon dioxide surface and a strong bond forms. The silicon dioxide surface often ends up functionalized with a monolayer of the silane. Hexamethyldisilazane (HMDS) is another substance that is often employed to render a silicon-based surface hydrophobic and improved transistor performance has been achieved with HMDS treated SiO2 gate dielectric as well. The silane layers are often applied after the source and drain electrodes for the TFT have been patterned on the gate dielectric. Since they are only monolayer thin, this layer does not cause much contact resistance in a TFT.

However, this silane surface modification does not work well for many gate dielectrics that do not have abundant hydroxyl groups at its surface, such as many polymer dielectrics. A hydrophobic (polymer) layer can be deposited instead, but simply adding a hydrophobic layer also partially covers the source and drain electrodes and causes contact problems since such layer typically may be thicker than a monolayer.

Other gate dielectrics may be used, but many do not have functional groups which allow binding of the surface modifiers, such as OTS or HMDS. For example, on organic dielectrics such as Polyvinylphenol (PVP), epoxy resins, Polyvinylalcohol (PVA), etc., silane coatings are less effective.

As a replacement for silane surface modification, hydrophobic polysilsesquioxane (PSSQ) layers have been employed. Liu et al. (JACS communications, 128 (14) 4554-4555, 2006) demonstrated excellent TFT mobility using a PP-PMMA gate dielectric which was coated with a Poly (methyl silsesquioxane). The semiconductor was PQT-12 and the source-drain electrodes were gold nanoparticles deposited onto the dielectric by mask-assisted microcontact printing. The PSSQ forms a thin layer on the surface of the underlying material and the layer does not depend on covalent bond formation as in the case of silane surface-modifiers. The thickness of the PSSQ layer may be several nanometer (nm) up to 10 s of nm, or higher. This known use of PSSQ layers, however, does not address the problems with attaining suitable source and drain contacts in a thin film transistor fabricated by inkjet-printing, for example.

INCORPORATION BY REFERENCE

U.S. application Ser. No. 12/324,207, filed on Nov. 26, 2008, entitled, "Thin Film Transistors and High Fill Factor Pixel Circuits and Methods for Forming Same," and naming Daniel et al. as inventors and U.S. application Ser. No. 12/324,304, filed on Nov. 26, 2008, entitled, "An Electronic Circuit Structure and Method for Forming Same," and naming Daniel et al. as inventors are incorporated herein by reference in their entirety.

BRIEF DESCRIPTION

In one aspect of the presently described embodiments, a transistor comprises a gate layer comprising a gate dielectric material, a source contact area and drain contact area disposed on the gate layer, a first coating applied to cover exposed areas of the gate layer and at least portions of the source contact area and the drain contact area, a second coating applied from a solution to selectively cover at least portions of the first coating covering the source contact area and the drain contacts area, and, a semiconductor disposed to be in contact with selected portions of the first and second coatings.

In another aspect of the presently described embodiments, the semiconductor is over the first and second coatings.

In another aspect of the presently described embodiments, the first coating is a low surface energy coating.

In another aspect of the presently described embodiments, at least a portion of the semiconductor is between the first and second coatings.

In another aspect of the presently described embodiments, the first coating is one of a polysilsesquioxane, a silane, a fluoropolymer or a silazane.

In another aspect of the presently described embodiments, the second coating is self-aligned to the source and drain contact areas.

In another aspect of the presently described embodiments, the second coating contacts to the source and drain contact areas through pinholes in the first coating.

In another aspect of the presently described embodiments, the second coating comprises at least one of PEDOT:PSS material, a conducting polymer, conducting nanoparticles, a material containing dopants and a semiconductor material.

In another aspect of the presently described embodiments, the source and drain contacts comprise at least one of carbon nanotubes, nanowires, and nanoparticles.

In another aspect of the presently described embodiments, the nanoparticles comprise at least one of gold nanoparticles, nickel nanoparticles, copper nanoparticles, silver nanoparticles, metal particles and metal oxide particles.

In another aspect of the presently described embodiments, at least a portion of the semiconductor is between two layers of the second coating.

In another aspect of the presently described embodiments, the semiconductor is disposed over the first coating and between two portions of the second coating.

In another aspect of the presently described embodiments, the method comprises depositing a gate layer comprising a dielectric on a substrate, depositing a source contact area and drain contact area on the gate layer, coating exposed areas of the gate layer and at least portions of the source contact area and the drain contact area with a first coating of a low surface energy material, applying a second coating from a solution to selectively cover portions of the first coating covering the source contact area and the drain contact area, and, depositing a semiconductor to be in contact with selected portions of the first coating and the second coating In another aspect of the presently described embodiments, the low surface energy material is PSSQ material.

In another aspect of the presently described embodiments, the depositing comprises printing.

In another aspect of the presently described embodiments, the second coating is deposited from a solution that fluidically pins to the source contact and the drain contact area.

In another aspect of the presently described embodiments, the second coating pins to the source contact area and the drain contact area through pinholes in the first coating In another aspect of the presently described embodiments, the second coating comprises PEDOT:PSS material, a conducting polymer, conducting nanoparticles, a material containing dopants and a semiconductor material.

In another aspect of the presently described embodiments, the source contact area and the drain contact area comprise at least one of carbon nanowires, nanoparticles and nanotubes.

BRIEF DESCRIPTION OF THE DRAWINGS

FIGS. 9 (a) through (c) illustrate a method according to the presently described embodiments;

DETAILED DESCRIPTION

In the presently described embodiments, the roughness, surface discontinuity and/or structural height of printed metal lines is used to pin a fluid. In at least one form, this fluid deposits over a hydrophobic or low-surface-energy layer (including a hydrophobic polymer layer) and is connected to bottom contacts (including printed contacts) through pinholes in the low surface-energy layer or/and through charge tunneling through that layer. This results in a sandwich-like contact structure achieved in a self-aligned deposition process. In one form, improved source-drain contact results in thin film transistors (TFTs) formed using an all-additive process. Although the present technique is described for printed circuits based on thin film transistors, it may be applied to electrodes in general. For example, it may also be used in optical devices such as organic light emitting diodes, in sensors, such as light sensors, photovoltaic devices or in microfluidic devices for application in biotechnology, chemistry, etc.

Figure 1:
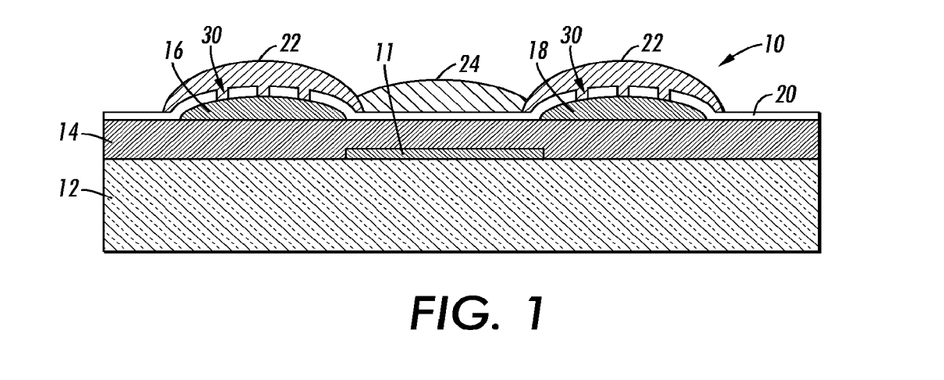
FIG. 1 is a cross-sectional view of a device according to the presently described embodiments.

With reference now to FIG. 1, as alluded to above, the pinning of contact solution (such as PEDOT:PSS or a solution of carbon nanotubes) on, for example, printed silver lines is shown. In one form, such pinning is facilitated by a relatively rough surface on the printed lines to help generate pinholes in a hydrophobic PSSQ polymer layer.

In this regard, as shown, a device such as a thin film transistor 10 is formed on a substrate 12. In at least one form, a gate dielectric layer 14 is disposed on the substrate 12. The gate dielectric layer 14 covers a gate electrode or gate area 11—which may take a variety of forms, is not always shown in the drawings herein and may be the substrate itself or, as shown in FIG. 1, a patterned conductor on the substrate 12. The gate dielectric layer 14 may be deposited by various methods such as oxidation, anodization, chemical vapor deposition, plasma deposition, evaporation, sputtering, atomic layer deposition, vapor deposition or by solution deposition such as printing, spin coating, spray coating, mist coating, slot coating, doctor blading or by a lamination method, etc. Many gate dielectric materials are known in the art, including oxides and nitrides such as silicon dioxide, silicon nitride, silicon oxynitride, tantalum oxide, aluminum oxide, hafnium oxide, zirconium oxide, polymeric dielectrics such as polyvinylphenol, polyvinylalcohol, polyimides, BOB (Cyclotene), polystyrene, PMMA, epoxides, urethanes, silicones, polysilsesquioxanes, polyvinylcinnamate, self-assembled organic dielectric multilayers (self-assembled nanodielectrics: SAND), Parylene, fluoropolymers, etc.

A source contact or source contact area 16 and drain contact or drain contact area 18 are printed or otherwise patterned on the gate dielectric layer 14. If, for example, inkjet printing is employed, the dielectric layer 14 has to have a surface energy that is compatible with the printed ink. A surface that is excessively hydrophobic will cause de-wetting of the ink and an excessively hydrophilic surface will cause spreading of the ink. In one example, an ink-jet ink is based on a water/ethylene glycol solvent and a 20% loading of silver nanoparticles. The dielectric surface is a polyvinylphenol polymer with a water contact angle around 50-70 degree. The printed ink may be annealed to 160 degC in order to sinter the nanoparticles. As can be seen in this example, the dielectric layer is chosen to be compatible with the printing process. The surface of the dielectric layer may be also treated before depositing the contact structures or defining areas, such as 16 and 18. The treatment may include plasma (e.g. oxygen plasma) or ozone treatment in order to change the surface energy of the dielectric so that it becomes compatible with the printing process (e.g. so that it becomes more hydrophilic if the dielectric material is too hydrophobic). However, for a well-performing transistor, a more hydrophobic surface (a surface with a lower surface energy) is required at least in the channel area of the transistor. In one example, a low surface energy surface has a water (of deionized water) contact angle above 70 degree, in a more specific example the water contact angle is greater than 80 degree and in a third example it is greater than 90 degrees. As will be discussed in greater detail below, a first coating layer 20 is deposited over the exposed areas of the gate dielectric layer and the source contact 16 and drain contact 18. The first coating layer may also be a low-k dielectric. Low-k dielectric interfaces to the semiconductor have been reported to result in reduced charge trapping in organic TFTs. A second coating layer 22 is applied to cover the source contact or source contact area and the drain contact or drain contact area, 16 and 18, respectively, in one form, in a self-aligning manner. Self-alignment of the second coating layer to source and drain contact areas is achieved by selective fluidic pinning. One characteristic of a self-aligned layer is one that has negligible uneven lateral offset with the layer or structure to which it is aligned; however, even lateral overhanging may also be self-aligned. This coating may form the actual electrical contact area and it may comprise a variety of materials, such as conducting polymers, conducting nanoparticles, a material that dopes a subsequently deposited semiconductor, but it may be also a semiconductor material. A semiconductor material 24, such as an organic semiconductor, is then deposited over selected portions of the first and second coatings. In this way, the semiconductor 24 is disposed over the gate dielectric layer 14, between the source contact or source contact area 16 and the drain contact or drain contact area 18, at least slightly covering the contact areas 22. Suitable electrical connection between these transistor elements can then be realized. In one example, all of the described layers are deposited by a printing method such as inkjet printing.

Notably, the first coating layer 20 functions to modify the surface energy and it, therefore, can be very thin, for example, 1-100 nm thin. Thin layers such as evaporated or solution processed layers tend to exhibit pinholes or other defects that disrupt the continuity of the layer. Pinholes—shown at 30, are formed therein on the surface of the source contact 16 and the surface of the drain contact 18. In this manner, the first coating layer 20 only covers portions of the source contact 16 and the drain contact 18, i.e. the pinholes leave portions of the source contact 16 and the drain contact 18 exposed. The pinholes may form primarily on the contacts because of the higher surface roughness of the contacts or because of the chemical composition of the contacts which may promote de-wetting of the coating layer 20. Accordingly, the second coating layer 22 that is applied to cover the source contact 16 and the drain contact 18 actually makes direct electrical contact to those components through the pinholes, such as those shown at 30. This configuration allows for improved performance of the thin film transistor 10 as will be detailed below.

In this regard, when using techniques such as ink-jet printing or other printing techniques such as screen printing, offset printing, flexographic printing, micro-contact printing, pad-printing, dip-pen printing, etc., to deposit source-drain electrodes (e.g. contacts 16 and 18) onto the gate dielectric 14 (e.g. in a bottom-gate TFT), the dielectric layer should not be excessively hydrophobic. Otherwise, the printed ink (e.g. silver nanoparticle ink) for the source and drain contacts 16 and 18 will de-wet and form discontinuous lines. A variety of dielectrics may be used but a gate dielectric such as polyvinylphenol (PVP) or SU-8 (MicroChem, Corp) was found to work well with water/ethylene-glycol-based silver nanoparticle inkjet inks. Continuous silver lines (or other suitable materials) can be jet-printed as source and drain contacts 16 and 18 on these dielectric materials. However, as alluded to above, PVP or SU-8 also have to be rendered hydrophobic at least in the channel area of a TFT to achieve good TFT performance. Good TFT mobilities for several organic semiconductors are achieved when coating the gate dielectric 14 and source and drain contacts 16 and 18 with a thin layer 20 of PSSQ material. The PSSQ hydrophobic coating which was described may be replaced by other low surface-energy coatings such as silicones (e.g. Techneglas 650 UP (Techneglas, Perrysburg, Ohio)) or thin fluorocarbon coatings (e.g. Cytop from Asahi Glass). Also, silane or silazane coatings may be applied if they attach to the surfaces. In some cases, the silanes may improve the contact resistance when they deposit on the contacts, but in other cases, it may be preferred to overcoat the contacts. In general, other materials may be used that improve the interaction of the semiconductor with the specific material and therefore the performance of the semiconductor. A thin layer of PMMA or polystyrene are examples of such materials.

Nonetheless, the hydrophobic layer is applied thin because the material also deposits onto the source and drain contacts 16 and 18. A thin layer tends to have pinholes (such as those shown at 30) and over the source-drain contacts 16 and 18 they allow current flow between the contacts 16 and 18 and the semiconductor 24.

The semiconductor 24 may be deposited by a solution process such as inkjet printing or dip-pen printing, spin-coating or other known solution deposition methods, or it may be evaporated, sputtered or deposited by other known deposition techniques. The semiconductor material may be an organic semiconductor such as a small molecule or polymeric semiconductor, it may be a precursor such as a pentacene precursor (e.g. TIPS pentacene). The surface roughness of the contacts 16 and 18 (e.g. printed silver lines) contributed to pinholes, because on smooth gold contacts we observed that the contact resistance with the PSSQ layer over the contacts was comparatively high. For example, the RMS roughness of evaporated gold on a silicon dioxide on silicon surface was 1.8 nm (Rmax ~43 nm). Jet-printed nanosilver had a RMS roughness of 7.1 nm (Rmax ~60 nm), as measured with an atomic force microscope (AFM). However, significant contact resistance was observed in many TFT structures.

So, after depositing the first layer 20 (e.g. a PSSQ layer) by spin-coating, dip coating, etc., the layer is annealed at 160° C. for ~30 min. This causes a cross-linking reaction which makes the surface of the first layer (e.g. the PSSQ layer) chemically inert to subsequent process chemicals. Alternatively, the first layer 20 may also serve as the base for silane attachment. In this case, the first layer 20 may also be treated with a plasma such as oxygen plasma or ozone to make the surface more reactive. Then a silane/silazane such as octadecyltrichlorosilane (OTS) or phenyltriethoxysilane or HMDS is attached to the surface.

A second coating layer 22 is then coated from a solution over the surface. This second coating layer 22 may be applied by various methods such as doctor-blading, dip-coating, ink-jet printing, spray coating, etc. In general, any solution may be used that forms a conductive or semiconductive layer or a layer with a desirable work function (e.g. a work function that is close to the Highest Occupied Molecular Orbital or Lowest Unoccupied Molecular Orbital level of an organic semiconductor). However, the surface tension of the solution has to be chosen so that it is repelled by the coating 20. In one example, the surface tension may be similar to water at ~72.8 mN/m. In another example it may be similar to toluene at 28.4 mN/m. In a third example, the surface tension of the solution may be between 25 and 73 mN/m. Higher surface tensions typically result in stronger fluid repellency from a low surface energy surface. A solution of the conducting polymer PEDOT:PSS (poly(3,4-ethylenedioxythiophene) poly(styrene sulfonate)) is used because PEDOT forms good contact with many organic semiconductors. Example PEDOT:PSS material is known under the brand name CLEVIOS™ from H.C. Starck.

The aqueous PEDOT:PSS solution which forms layer 22 is repelled by the hydrophobic coating layer 20, except in regions with patterned silver. In the example of a doctorblading process, if the speed of coating and the viscosity/surface tension of the solution is in an acceptable range, the PEDOT solution selectively gets pinned on the printed silver source and drain contacts 16 and 18. The higher roughness of the PSSQ-coated silver (~4.4 nm RMS; ~40-nm Rmax) versus the smoothness of the PSSQ-coated PVP region (~0.8 nm RMS; ~9 nm Rmax) may contribute to the pinning. In addition, if pinholes are present in the layer 20, the "pinholes" in the first layer 20 above the silver may appear hydrophilic, because the actual contact material of lines 16 and 18 is hydrophilic. The hydrophilic nature may be partially due to the dispersant that is present in many silver nanoparticle based printing inks. Polyvinylpyrrolidone is one example of such a dispersant. Moreover, the edges of the printed structures 16 and 18 act as fluidic pinning points. Contact line pinning of fluids on rough surfaces or on topographies such as steps in the surface is a well known phenomenon which depends on the viscosity and surface tension of the fluid as well as on the fluid dynamics and on the surface properties such as surface energy and structural height of surface steps. It may be required to apply several layers of coating so that the silver lines are completely covered. After each coating process, the layer has to dry. The application of the second coating is substantially a self-aligned process because the pads 16 and 18 serve as a template for the fluidic deposition of the material 22 from solution. If multiple layers are applied, the layers may comprise different materials. For example, a solution of carbon nanotubes may be coated over a layer of PEDOT:PSS. If an inkjet deposition method is used to deposit the material 22, then different materials may be deposited over different contacts. This may be useful if p and n-type transistors are patterned on the same substrate or it may be applied within one transistor structure to coat the source and the drain with different materials (with different work function) which can be useful for light emitting transistors. It can also be seen that the structures 16 and 18 do not have to be conductors. They may just function as templates to pin the fluid 22 which forms the actual conductor or contact material for the TFT or other device. For example, the contact structures 16 and 18 may comprise jet-printed titania particles or of a porous polymer, etc. A range of materials may be used to deposit the contact material 22: for example solutions of organic conductors (such as polypyrrole, polyaniline, polythiophenes), conducting nanoparticle inks (such as silver, gold, copper, nickel nanoparticles, flakes or wires as well as carbon nanotubes, etc.), conducting polymer ink containing dopants for the semiconductor, other ink that contains a dopant or dopant precursor for a semiconductor (such as a sulfonic acid dopant, e.g. camphor sulfonic acid), etc. Moreover, the work function of the contact material 22 may be adjusted by chemical doping/de-doping or by electrochemical oxidation or reduction. This may be done after deposition of the contact material 22 onto the structures 16 or 18.

Figure 2:
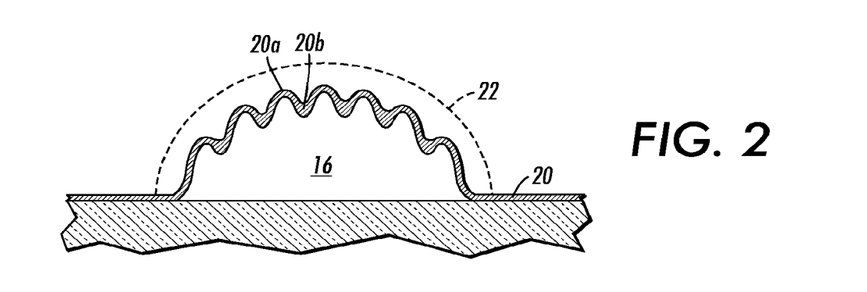
FIG. 2 is a cross-sectional view of a device according to the presently described embodiments.

With reference to FIG. 2, it should be noted that, in the absence of pinholes, an electrical contact may nonetheless be established through tunnel currents when the layer 20 is very thin. The increased roughness of the surface of contact 16 may, for example, modulate the thickness of the layer 20, so that the layer has a thickness of only a few nm or less at protrusions 20a and a greater thickness in valleys 20b.

Figure 3:
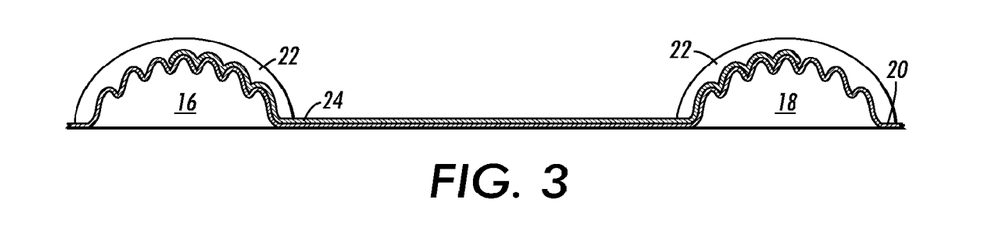
FIG. 3 is a cross-sectional view of a device according to the presently described embodiments.

There are also other variations of the described process and embodiments contemplated. In the heretofore described process, the semiconductor material is deposited as the final step over layer 22. However, as in FIG. 3, the semiconductor 24 may also be deposited before layer 22. Most semiconductor layers are very thin (e.g. 10 s of nm) and therefore, the roughness of the contacts 16 or 18 which contributes to the fluidic pinning may not be substantially leveled out by the semiconductor layer. Therefore, the layer 22 may be deposited after depositing the semiconductor.

Figure 4:
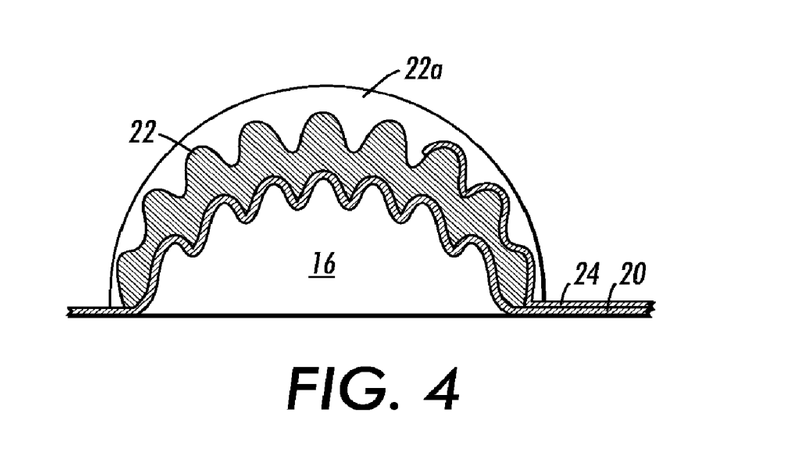
FIG. 4 is a cross-sectional view of a device according to the presently described embodiments.

Moreover, as illustrated in FIG. 4, the semiconductor layer 24 may be sandwiched between two coating layers 22 and 22a which, in at least one form, take the form of layers described above. This may improve charge injection into the semiconductor layer. The two layers 22 and 22a may also comprise of two different materials with different work function which may allow or improve bipolar TFT operation.

Figure 5:
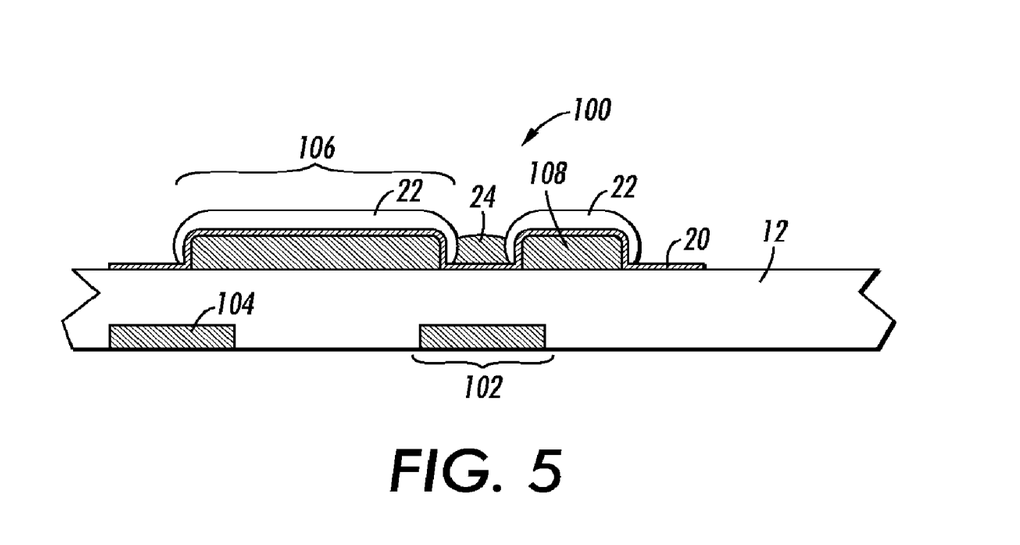
FIG. 5 is a cross-sectional view of a device according to the presently described embodiments.

Furthermore, as illustrated in FIG. 5, the described concept is not limited to TFTs. It can be extended to other devices and electronic circuits. FIG. 5 shows the cross section of an active-matrix pixel circuit 100 comprising a pixel TFT 102, a pixel capacitor 104 and a pixel pad 106. Here, the source electrode of the TFT is extended to form the pixel pad 106. In the overcoating process, the layer 22 covers the drain electrode 108 (which are the data lines) and the pixel pad 106. The pixel pad 106 has to have a good conductivity in many displays because charge has to be transferred to the display medium or current has to flow through the display medium. Therefore, the insulating layer 20 would be undesirable on the pixel surface. As shown, the semiconductor 24 is disposed over the first coating 20 but between different portions of the second coating 22 which coat different components in the circuit.

Figure 6:
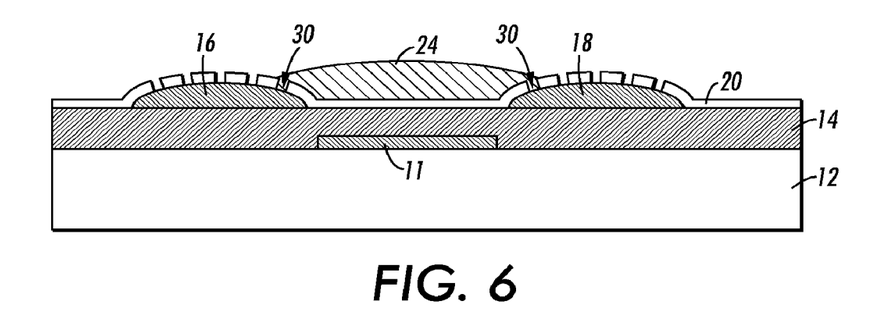
FIG. 6 is a cross-sectional view of a device according to the presently described embodiments.

With reference to FIG. 6, a configuration is shown wherein the second layer 22 is not provided. In such an embodiment, the semiconductor 24 has direct contact with the contacts 16 and 18 through the pinholes 30.

Figure 7:
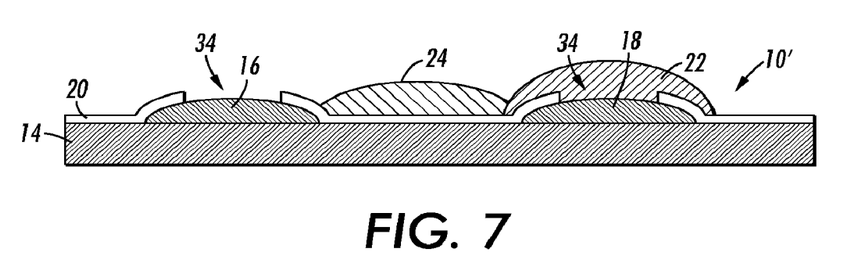
FIG. 7 is a cross-sectional view of a device according to the presently described embodiments.
Figure 8:
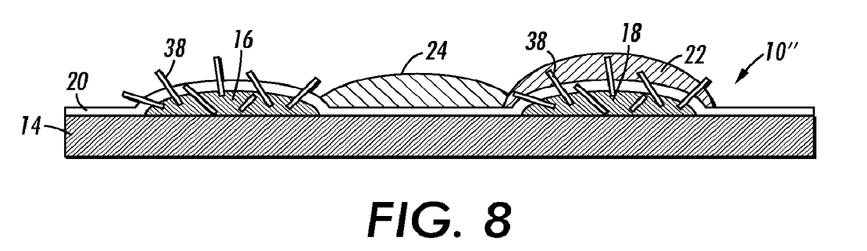
FIG. 8 is a cross-sectional view of a device according to the presently described embodiments.

With reference to FIGS. 7 and 8, other possible mechanisms that would allow connection between a bottom contact such as the source contact 16 and the drain contact 18 and an overcoated material 22 are shown. In FIG. 7, the low-surface-energy coating 20 of device 10' de-wets in a larger area 34 near the top or center of the contact. In an extreme case, the coating 20 completely de-wets from the contact area. The partial or complete de-wetting may be caused by additives, such as dispersants, in the material of the bottom contact areas 16 or 18.

In FIG. 8, conductive nanostructures 38 such as nanotubes, nano-wires or nano-ribbons are embedded in the bottom contact material, such as the source contact 16 and drain contact 18 of device 10". These nano-structures may include carbon nanotubes, silicon nanowires, silicon nanoriboons, zinc oxide nanowires, metal nanowires such as tungsten nanowires or flakes such as indium tin oxide flakes, etc. The semiconductor material in FIG. 8 as well as in all the described TFT structures also may include nanoparticle-, nanowire-, nanoribbon-, nanotube-semiconductors such as carbon nanotubes, silicon nanowires, zinc oxide nanowires, or graphene or chalcogenite semiconductors such as In—Ga—ZnO semiconductor material and other semiconductor materials known in the art. If the structures 38 partially protrude from the surface and if they are not coated by the low-surface energy coating 20, then they provide an effective connection to the over-coated contact material 22 and they may also promote fluidic pinning. Also, larger particles may be added to the material of contacts 16 and 18 to increase the surface roughness. For example, TiO2 particles, other conductive, semiconductive, insulating nanoparticles or larger silver particles may be added to a silver nanoparticle ink. For example, if the typical size of silver nanoparticles is around 50 nm, then TiO2 particles on the order of 80-300 nm may be added to increase the roughness.

Figure 9A:
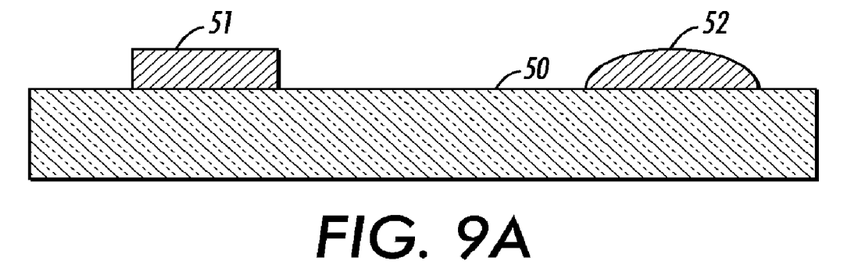
Figure 9B:
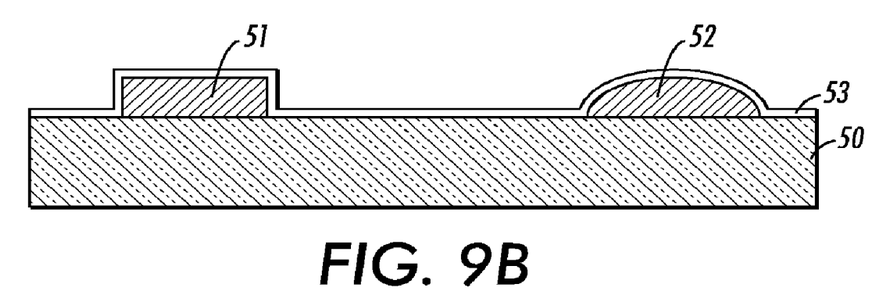
Figure 9C:
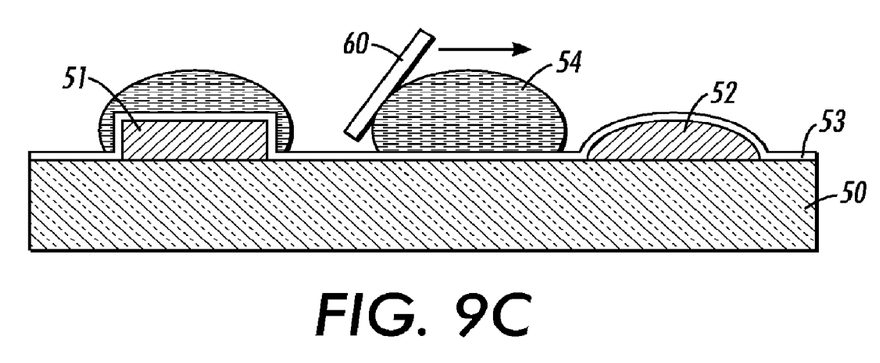
Figure 10:
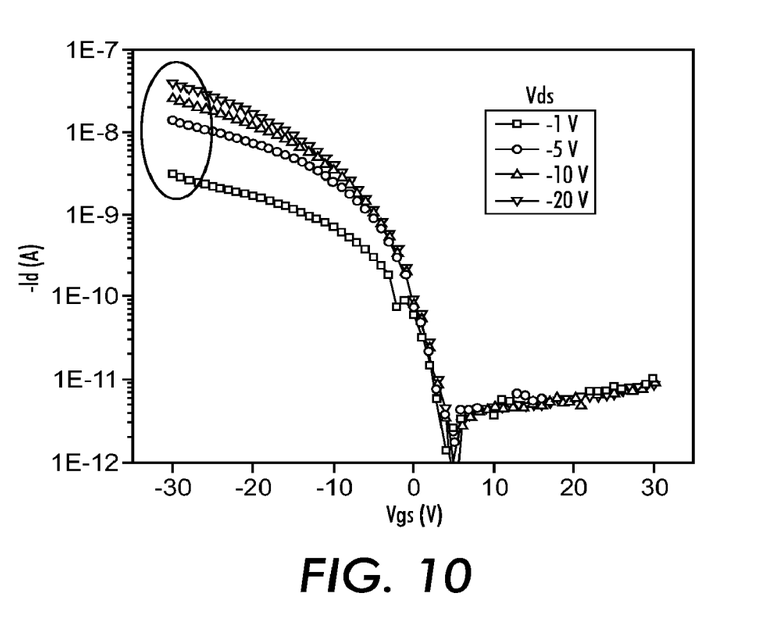
FIG. 10 is a graph illustrating transfer and output curves.
Figure 11:
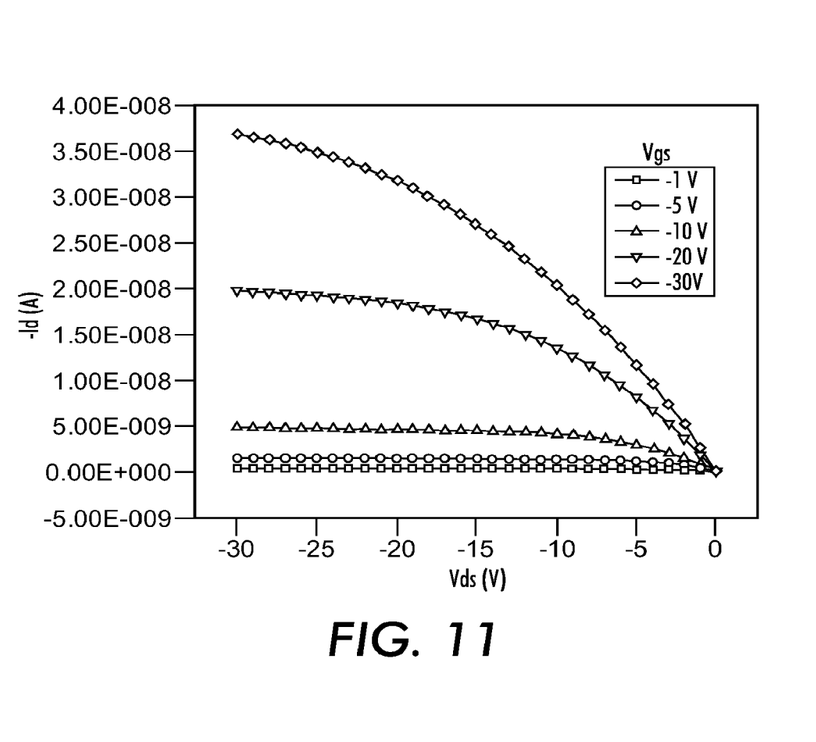
FIG. 11 is a graph illustrating transfer and output curves.
Figure 12:
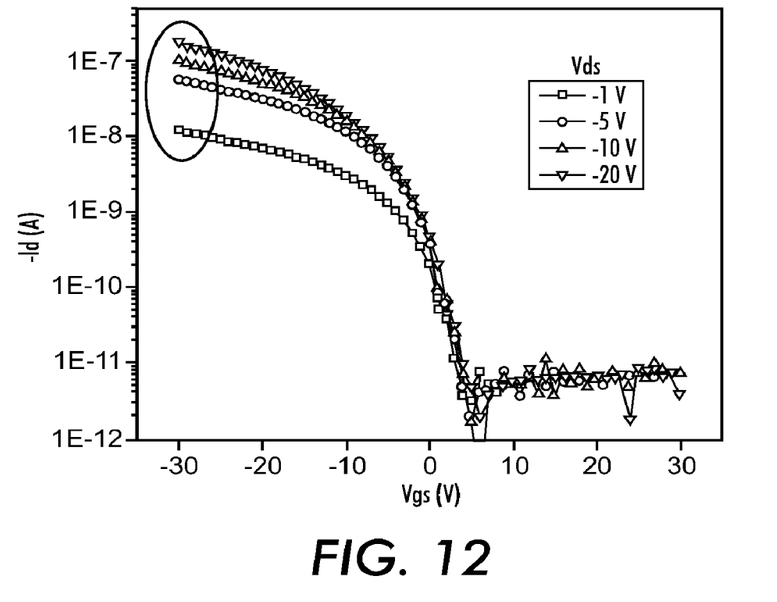
FIG. 12 is a graph illustrating transfer and output curves.
Figure 13:
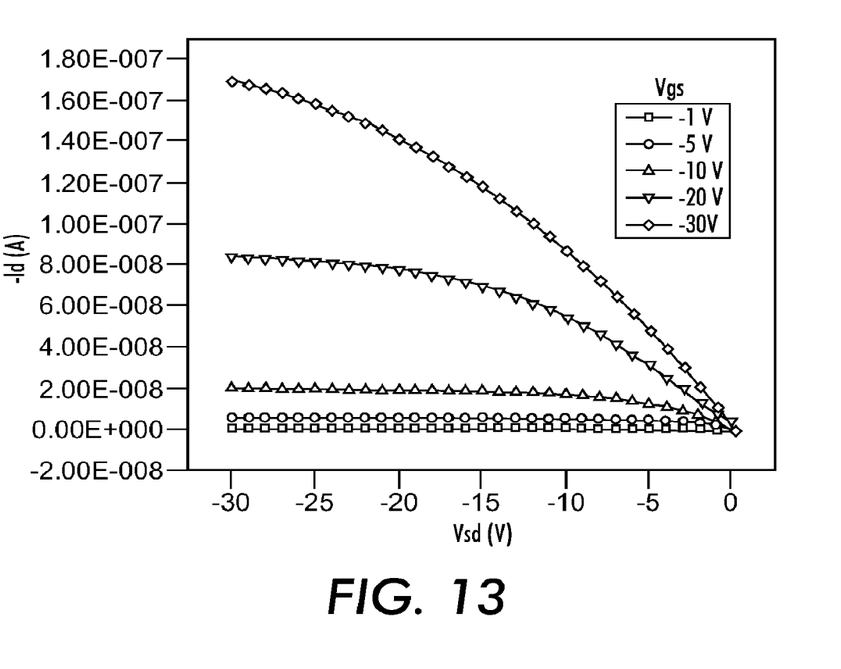
FIG. 13 is a graph illustrating transfer and output curves.

With reference to FIGS. 9(a) through (c), a schematic of an example coating process according to the presently described embodiments is illustrated. This process may be applied to a variety of thin-film applications. In FIG. 9(a), the features or areas 51 and 52, which are contacts in one form, are deposited on a substrate 50. They may be deposited by a printing method such as jet-printing, offset printing, flexography, pad printing, screen printing, extrusion printing, aerosol printing, stamping or other printing methods known in the art. They may also be deposited with other methods that leave a relatively rough surface. For example, the material that forms contact 51 may be deposited by a vacuum deposition technique such as evaporation, sputter deposition, cathodic arc deposition, laser deposition, chemical vapor deposition, plasma deposition, etc. Moreover, it may be deposited by a plating method such as electroplating or electroless plating. The material may be also deposited by a combination of above techniques. If the contact 51 is not directly patterned with a selective printing method, the contact area may be patterned from a continuous film. This patterning may be done by photolithography and subsequent etching methods such as wet etching or dry etching or it may be patterned by laser ablation or any other patterning methods known in the art. The contact 51 may be also patterned by a combination of above methods. For example, a seedlayer (such as a layer of Gold) may be first patterned using photolithography or deposition through a shadow-mask, then a second layer may be selectively deposited onto the seedlayer by electro- or electroless plating (e.g. of nickel metal). The material for features 51 or 52 may be an electrically conducting material, but it may also be a semiconductor, an insulator, a superconducting material or a magnetic (such as ferromagnetic) material. The material may be opaque or transparent to light. If the material is deposited by a vacuum deposition method or plating method, then the deposition conditions may be adjusted so that the surface roughness is increased. This can often be achieved e.g. by sputter deposition at a high ion flux or by electroplating at relatively high currents. The contact 51 may also simply exhibit an edge roughness due to a photolithographic patterning step. In FIG. 9(b) the low surface-energy layer 53 is deposited. This may be a polysilsesquioxane, a silicone, a silane with long alkyl chain, a fluorinated silane or other silane (such as OTS, phenyltriethoxysilane, etc.), a silazane, such as (HMDS), polystyrene, PMMA or a thin fluorocarbon or fluoropolymer layer (such as Cytop from Asahi Glass), a thin Parylene layer, for example. Materials such as Aquaphobe®, Glassclad®, Siliclad®, Siliglide™, Seramic™, HardSil™, Zipcone™, all from Gelest, Inc. of Morrisville, Pa., may be suitable as a low surface-energy material 53. Silanes such as perfluorooctylsilane, perfluorodecylsilane, octylsilane, n-dodecylsilane, octadecylsilane, perfluorooctyltriethoxysilane, perfluorodecyltrichlorosilane, acryloxypropyltrimethoxysilane, allyltrimethoxysilane may be other examples for potential low surface-energy materials 53. The layer is thin enough so that it does not substantially smoothen out the surface or edge roughness of the underlying contact areas. In one example this layer is 1-50 nm thin. The layer may be deposited by various methods, including spin-coating, dip-coating, doctor-blading, slot-coating, spray-coating, mist-coating, vapor coating, thermal evaporation, plasma deposition, etc. In FIG. 9(c), fluid 54 is coated over the surface using, for example, a blade 60. The fluid is pinned on the features 51 and 52. The surface tension of fluid 54 is chosen so that it is repelled from the surface in the area between and outside the contacts and pinned on the contacts. Typically a fluid is said to be repelled from a surface if the fluid contact angle is at least 90 degree. Although FIG. 9(c) shows a doctorblading method for depositing the fluid 54, other methods may be used. For example, the fluid may be deposited by an inkjet-printing method. If the deposited fluid drops are slightly misaligned with respect to the areas 51 and 52 due to the printing process, they will be pulled back to the areas due to surface tension as long as a substantial fraction of the fluid lands on the area. The fluid 54 may be also deposited by dip coating, meniscus coating, spin coating, spray coating, etc. The deposition process may be followed by a centrifugation or air-stream in order to blow off excess fluid that has deposited in the areas between the areas 51 or 52. If inkjet-printing is used to deposit the fluid 54, then the different pads 51 or 52 may be coated with different materials. In one example, the different materials are conductors having a different work function. Examples of materials 54 are polyacetylene, PEDOT:PSS (various grades of CLEVIOS from H.C. Starck exhibit different work functions), other conducting conjugated polymers, carbon nanotube solutions, nanowire solutions, indium tin oxide particle solutions, carbon particle solutions, metal nanoparticle solutions. The particle solutions may contain particles that are functionalized with self assembled monolayers such as silanes or thiols, for example, to improve the charge injection to a semiconductor material. For example, gold surfaces treated with 2-mercapto-5-nitrobenzimidazole or with 2-mercaptobenzimidazole have been reported to have different charge injection behavior with a copperphtalocyanine semiconductor.

Referring now to FIGS. 10-13, transfer and output curves of a TFT are shown with only silver source/drain contacts overcoated with PSSQ and of a TFT (same geometry) with over-coated PEDOT over the PSSQ coated contacts. The transistor currents of the TFT structures with PEDOT s/d were consistently higher. FIGS. 10-13 shows that the performance of TFTs with the additional contact coating is improved. Other measurements have shown consistently a decreased current crowding effect in the output curves of TFTs with PEDOT:PSS over-coated contacts (with PSSQ layer). Current crowding is due to high contact resistance in a TFT and it becomes more apparent the shorter the channel length of a TFT.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of forming a thin film transistor, the method comprising:
    depositing a gate layer comprising a dielectric on a substrate;
    depositing a source contact area and drain contact area on the gate layer;
    coating exposed areas of the gate layer and at least portions of the source contact area and the drain contact area with a first coating of a low surface energy material;
    applying a second coating from a solution to selectively cover portions of the first coating covering the source contact area and the drain contact area; and,
    depositing a semiconductor to be in contact with selected portions of the first coating and the second coating.

2. A method according to claim 1 wherein the low surface energy material is PSSQ material.

3. A method according to claim 1 wherein the depositing comprises printing.

4. The method according to claim 1 wherein the second coating is deposited from a solution that fluidically pins to the source contact and the drain contact area.

5. The method according to claim 1 wherein the second coating pins to the source contact area and the drain contact area through pinholes in the first coating.

6. The method according to claim 1 wherein the second coating comprises at least one of PEDOT:PSS material, a conducting polymer, conducting nanoparticles, a material containing dopants and a semiconductor material.

7. The method according to claim 1 wherein the source contact area and the drain contact area comprise at least one of carbon nanowires, nanoparticles and nanotubes.

* * * * *